(12) United States Patent
Ishida et al.

(10) Patent No.: US 7,718,453 B2
(45) Date of Patent: May 18, 2010

(54) ORGANIC ELECTROLUMINESCENT DEVICE, METHOD OF MANUFACTURING THE SAME, AND ELECTRONIC APPARATUS

(75) Inventors: Masaya Ishida, Suwa (JP); Masahiro Furusawa, Suwa (JP); Katsuyuki Morii, Suwa (JP); Osamu Yokoyama, Shiojiri (JP); Satoru Miyashita, Chino (JP); Tatsuya Shimoda, Fujimi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/821,878

(22) Filed: Jun. 26, 2007

(65) Prior Publication Data

US 2007/0249076 A1    Oct. 25, 2007

Related U.S. Application Data

(62) Division of application No. 10/002,393, filed on Nov. 2, 2001, now Pat. No. 7,253,433.

(30) Foreign Application Priority Data

Nov. 2, 2000  (JP) .............. 2000-336391
Nov. 1, 2001  (JP) .............. 2001-336830

(51) Int. Cl.
    *H01L 33/00*  (2006.01)
(52) U.S. Cl. ................. 438/29; 257/E33.068
(58) Field of Classification Search .......... 438/28, 438/29, 48, 128, 149; 257/40, 59, 72, E33.068
    See application file for complete search history.

(56) References Cited

U.S. PATENT DOCUMENTS

| | | | |
|---|---|---|---|
| 5,747,930 A | 5/1998 | Utsugi | |
| 5,970,318 A * | 10/1999 | Choi et al. | ............... 438/99 |
| 6,054,725 A | 4/2000 | Liedenbaum et al. | |
| 6,087,196 A | 7/2000 | Sturm et al. | |
| 6,150,668 A | 11/2000 | Bao et al. | |
| 6,300,988 B1 | 10/2001 | Ishihara et al. | |
| 6,303,277 B1 | 10/2001 | Hieda et al. | |
| 6,335,539 B1 | 1/2002 | Dimitrakopoulos et al. | |
| 6,420,200 B1 | 7/2002 | Yamazaki et al. | |
| 6,545,291 B1 | 4/2003 | Amundson et al. | |
| 6,555,840 B1 * | 4/2003 | Hudson et al. | ............... 257/40 |
| 6,617,613 B2 | 9/2003 | Matsuo et al. | |
| 6,657,225 B1 | 12/2003 | Inoue | |
| 6,712,661 B1 | 3/2004 | Kiguchi et al. | |
| 6,750,473 B2 | 6/2004 | Amundson et al. | |
| 6,819,374 B2 | 11/2004 | Sekiguchi | |
| 6,843,937 B1 | 1/2005 | Kiguchi et al. | |
| 6,872,973 B1 | 3/2005 | Koyama et al. | |
| 7,091,073 B2 | 8/2006 | Inoue | |
| 7,315,295 B2 * | 1/2008 | Kimura | ............... 345/92 |

(Continued)

FOREIGN PATENT DOCUMENTS

JP    02-058028    2/1990

(Continued)

*Primary Examiner*—Nathan W Ha
(74) *Attorney, Agent, or Firm*—Harness, Dickey & Pierce, P.L.C.

(57) ABSTRACT

An organic electroluminescent device comprising: an organic thin-film transistor element including at least an active layer made of an organic material; and an organic electroluminescent element driven by the organic thin-film transistor element.

12 Claims, 12 Drawing Sheets

U.S. PATENT DOCUMENTS

| | | | |
|---|---|---|---|
| 2002/0044109 A1 | 4/2002 | Kimura | |
| 2005/0058770 A1 | 3/2005 | Kiguchi et al. | |
| 2006/0046358 A1 | 3/2006 | Yamazaki et al. | |
| 2009/0032810 A1* | 2/2009 | Aoki | 257/40 |

FOREIGN PATENT DOCUMENTS

| | | |
|---|---|---|
| JP | 05-152560 | 6/1993 |
| JP | 10-189252 | 7/1998 |
| JP | 10-209459 | 8/1998 |
| JP | 11-040358 | 2/1999 |
| JP | 11-340417 | 12/1999 |
| JP | 2000-098588 | 4/2000 |
| JP | 2003-282883 | 10/2003 |
| JP | 2004-146430 | 5/2004 |
| JP | 2005-229084 | 8/2005 |
| JP | 2005-277017 | 10/2005 |
| WO | WO 9966540 | 12/1999 |
| WO | WO00-18193 | 3/2000 |

* cited by examiner

[Fig. 1]
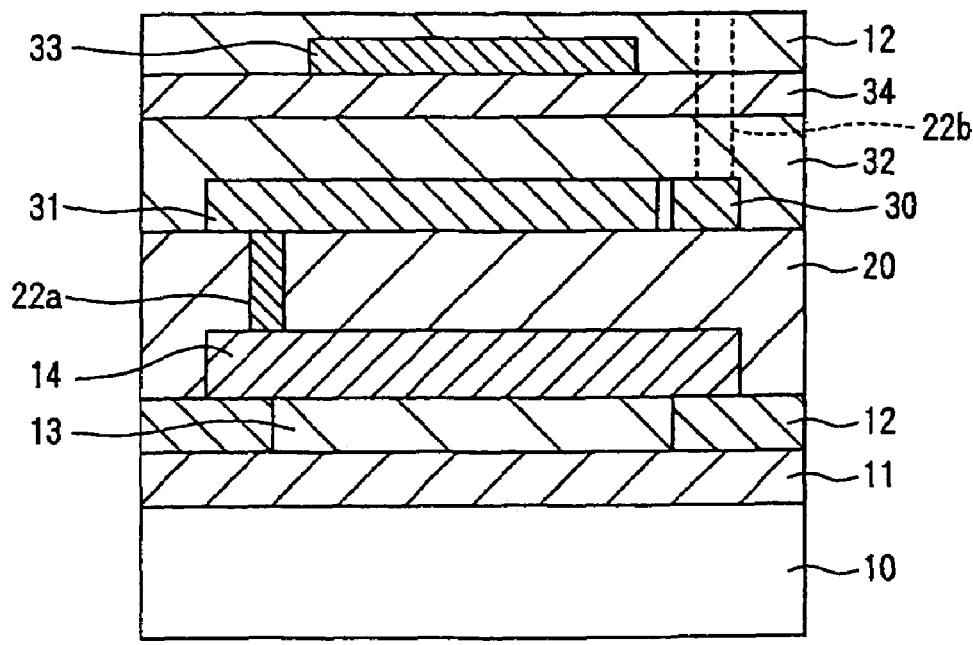
[Fig. 2]
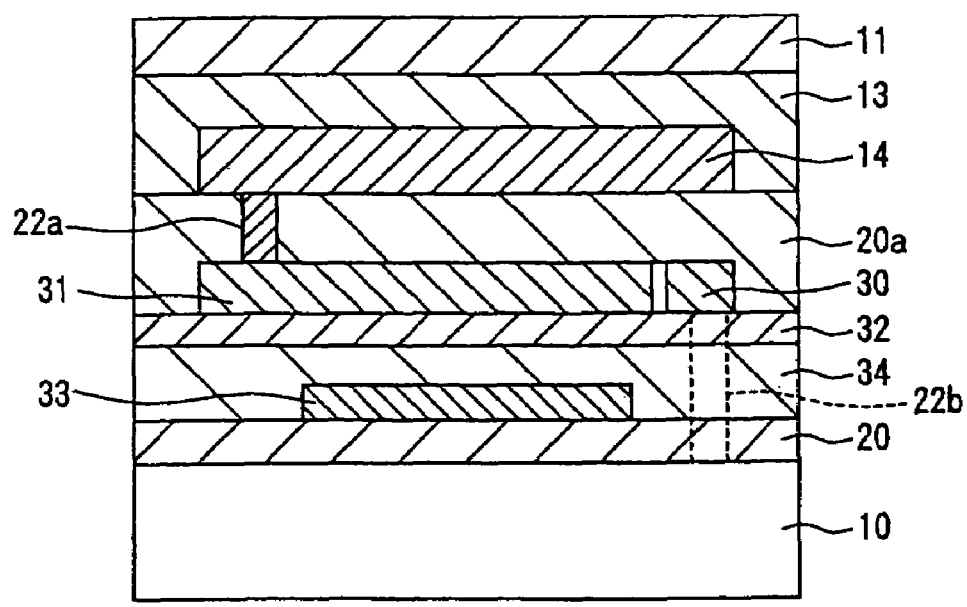

[Fig. 3]
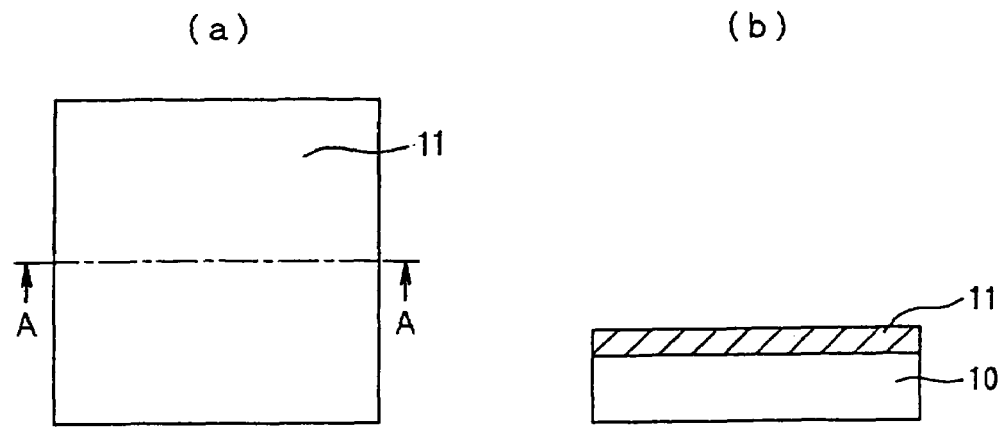
[Fig. 4]
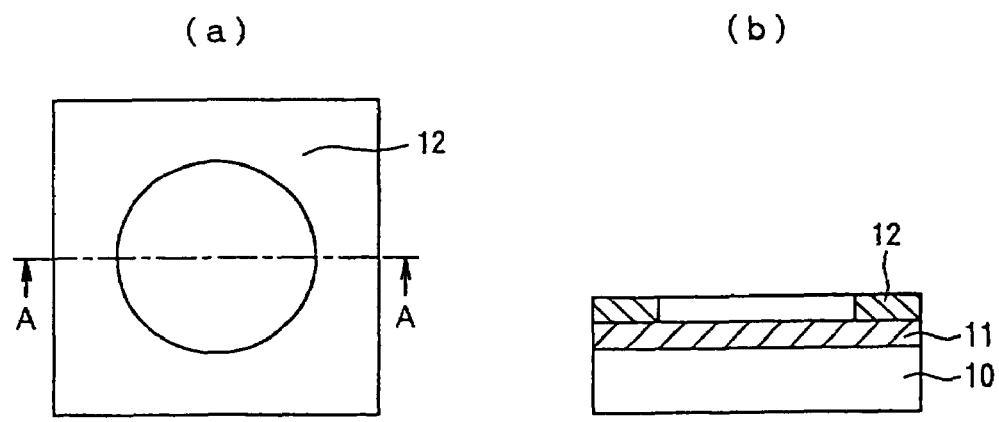
[Fig. 5]
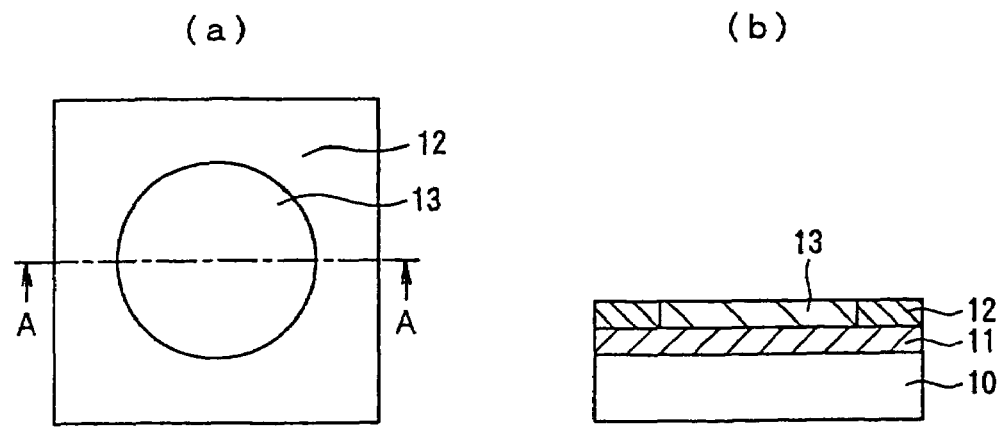

[Fig. 6]
(a) 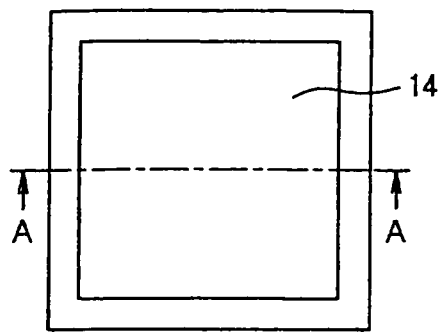
(b) 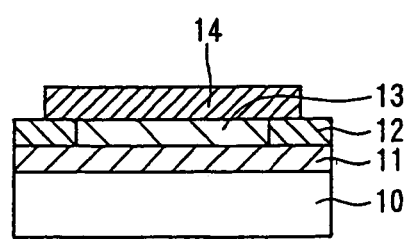
[Fig. 7]
(a) 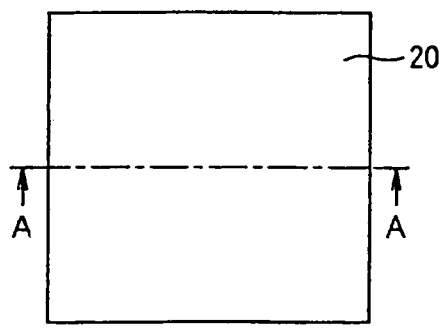
(b) 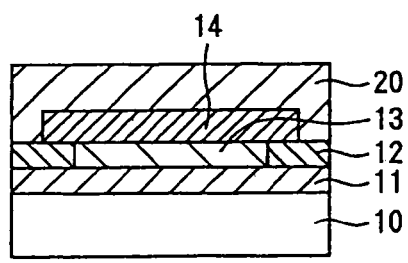
[Fig. 8]
(a) 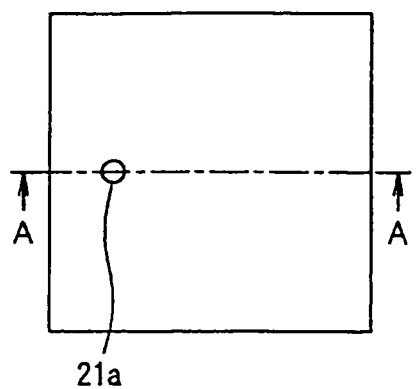
(b) 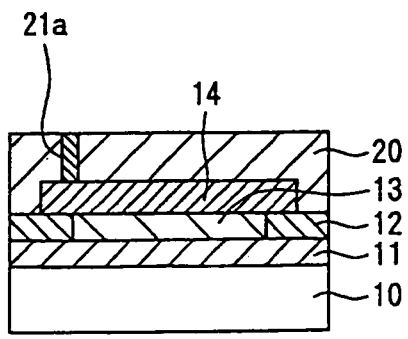

[Fig. 9]
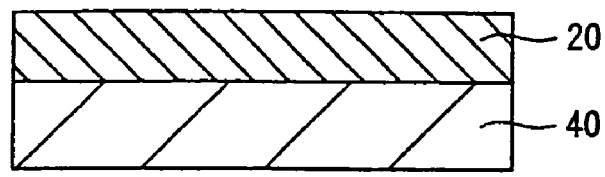
[Fig. 10]
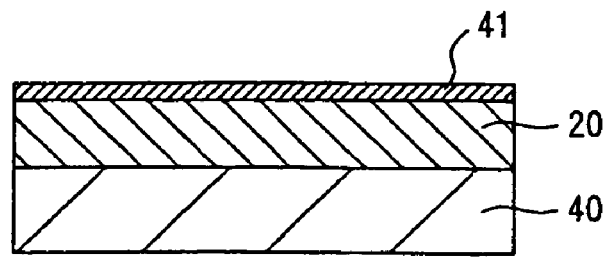
[Fig. 11]
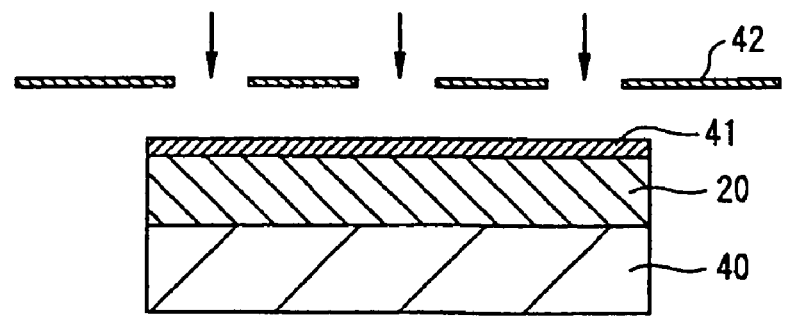

[Fig. 12]
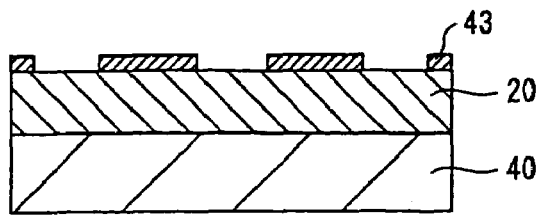
[Fig. 13]
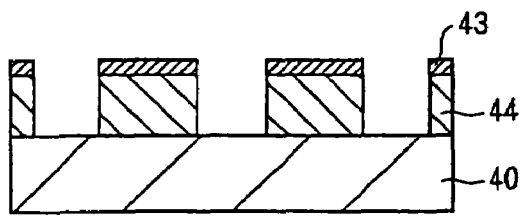
[Fig. 14]
(a)
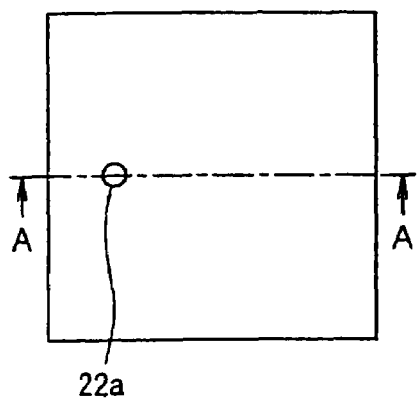
(b)
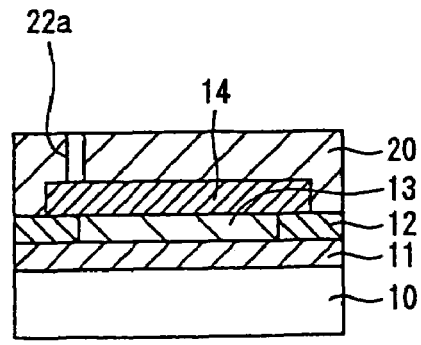

[Fig. 15]
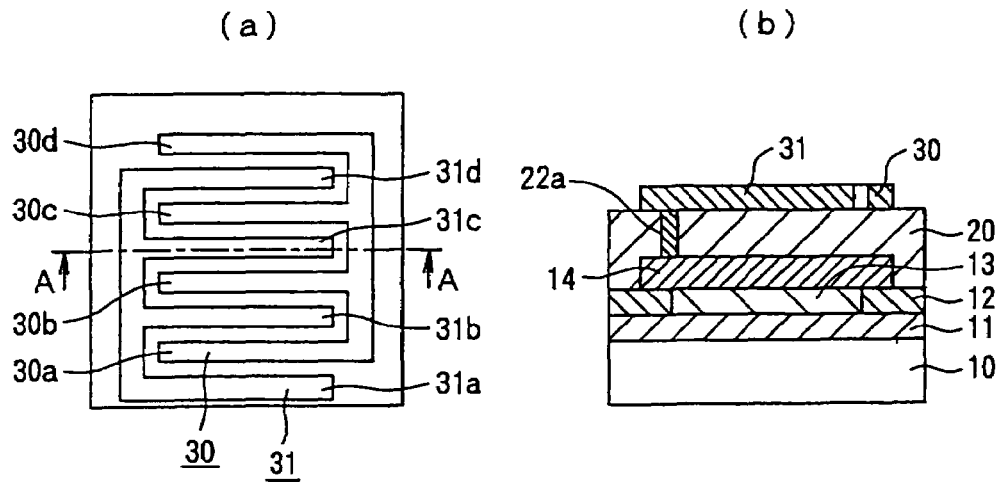
[Fig. 16]
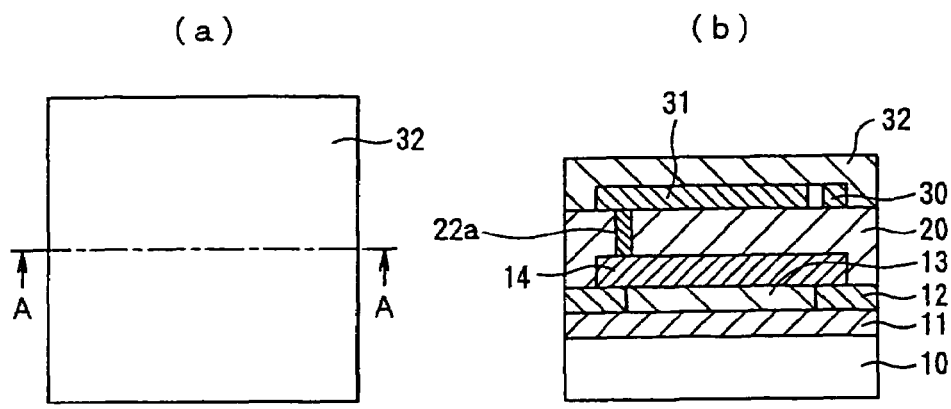
[Fig. 17]
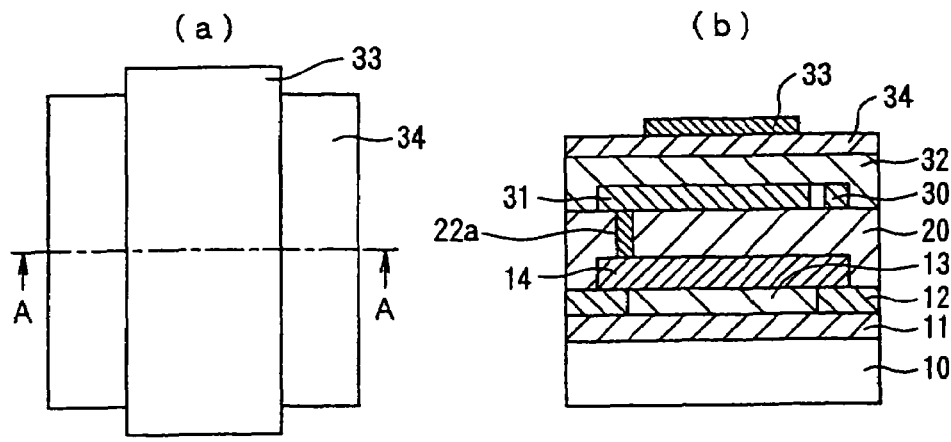

[Fig. 18]
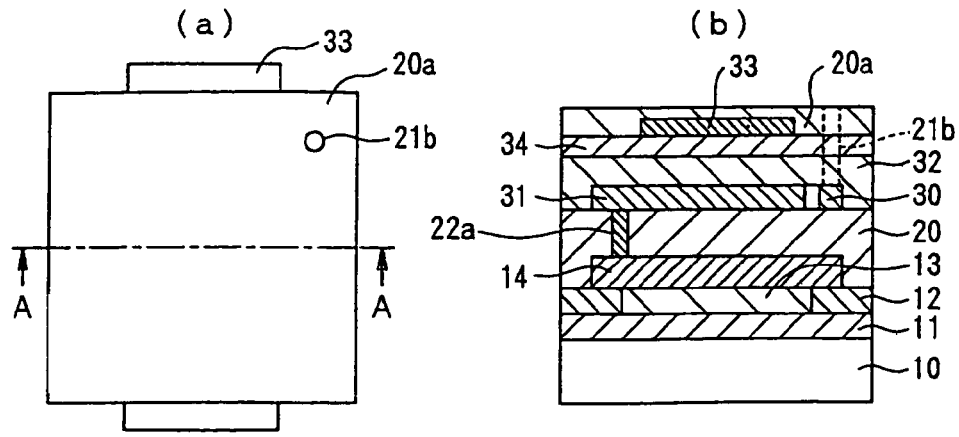
[Fig. 19]
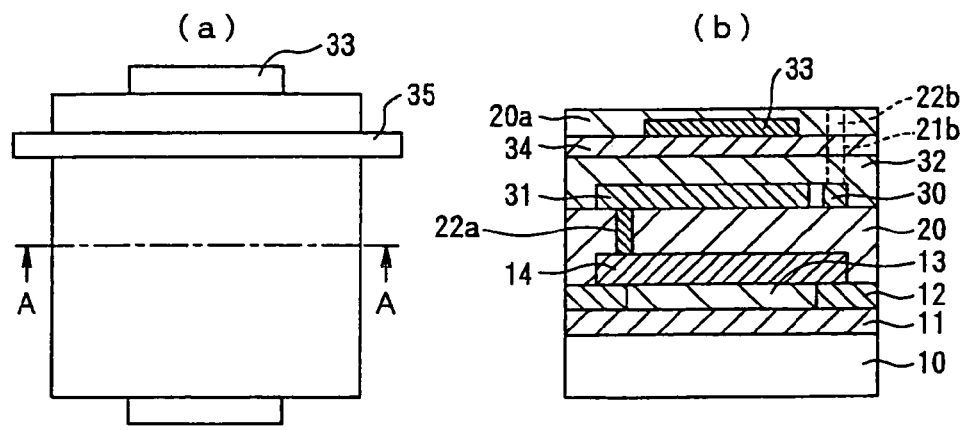
[Fig. 20]
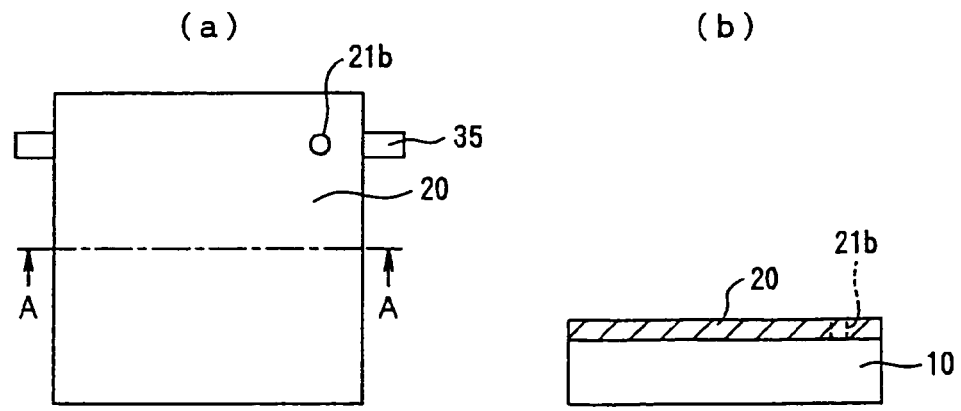

[Fig. 21]
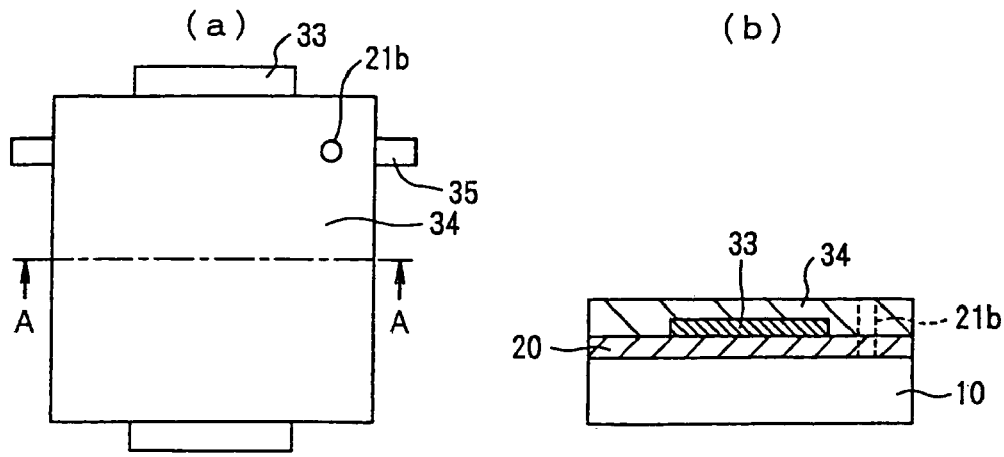
[Fig. 22]
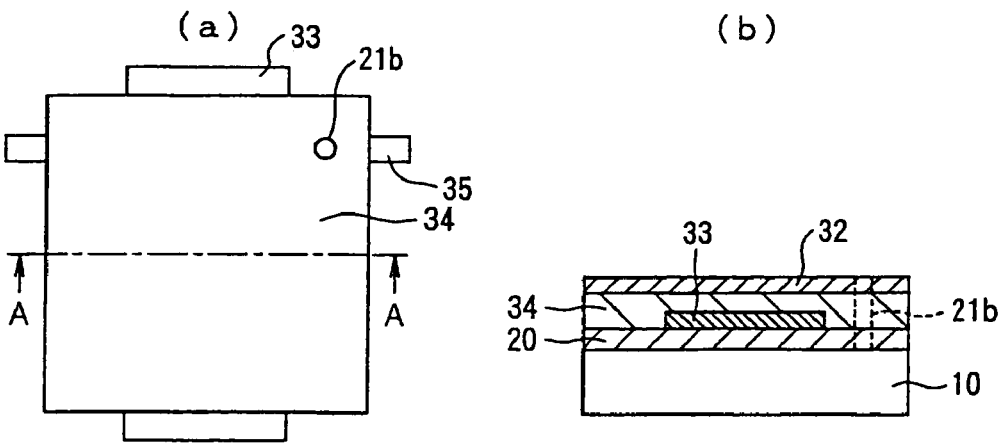
[Fig. 23]
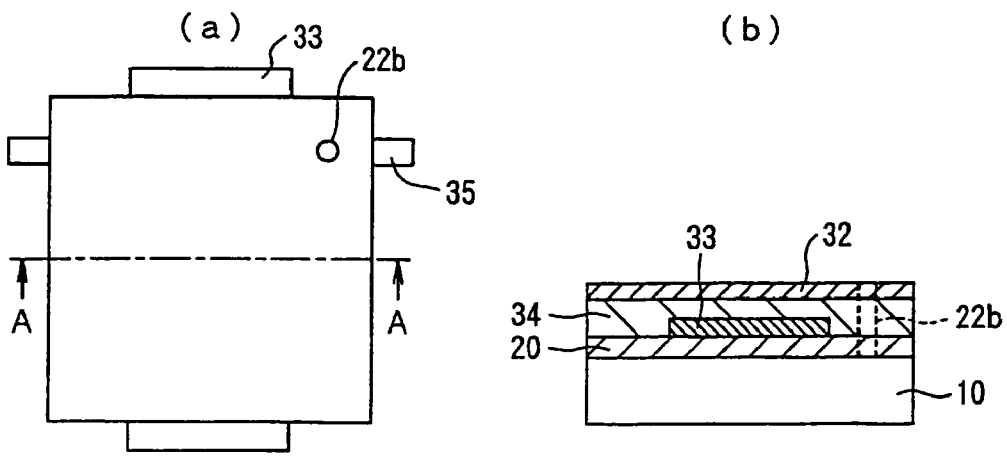

[Fig. 24]
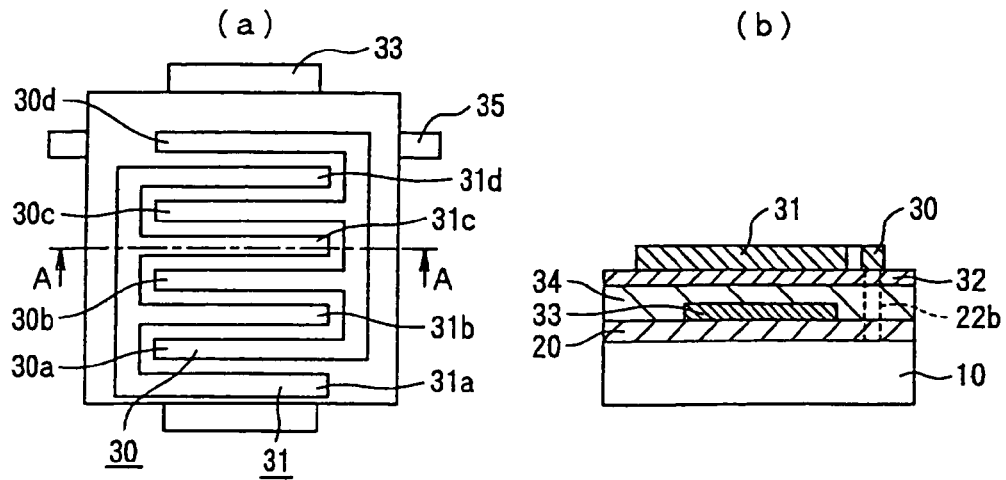
[Fig. 25]
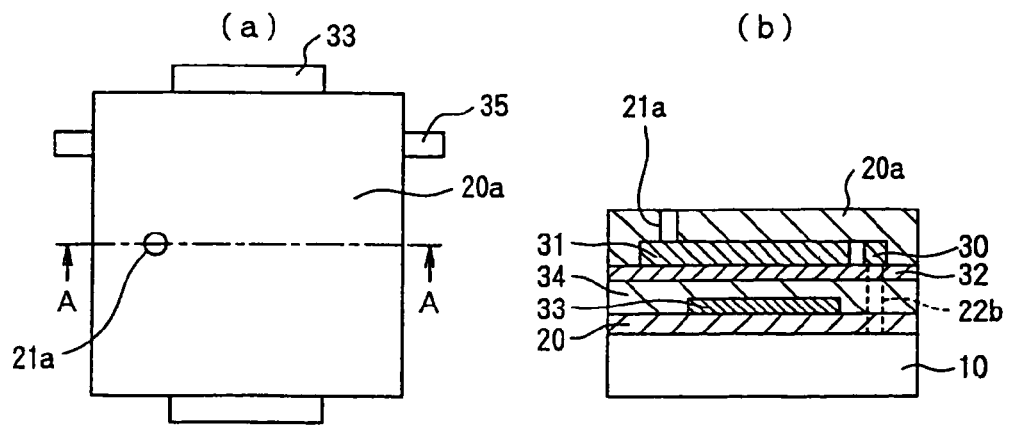
[Fig. 26]
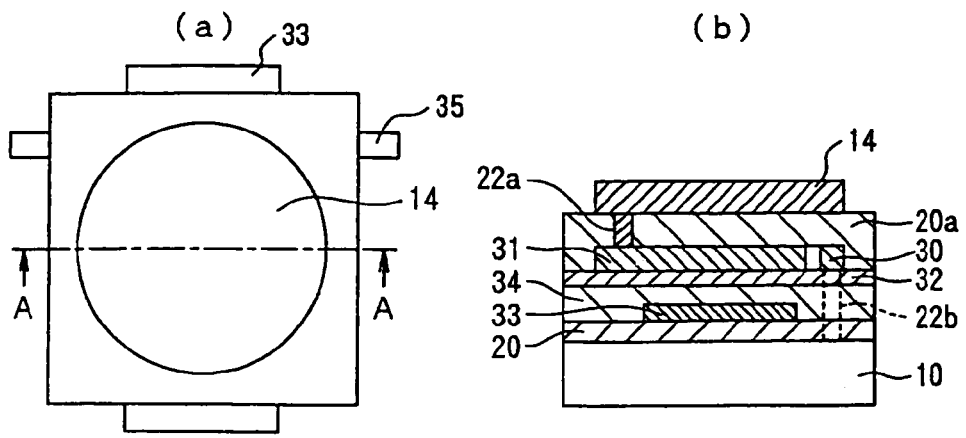

[Fig. 27]
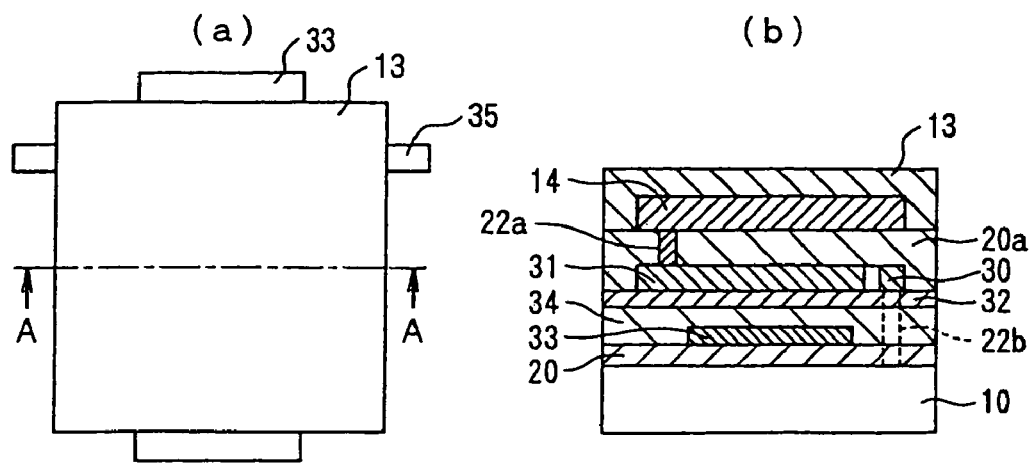
[Fig. 28]
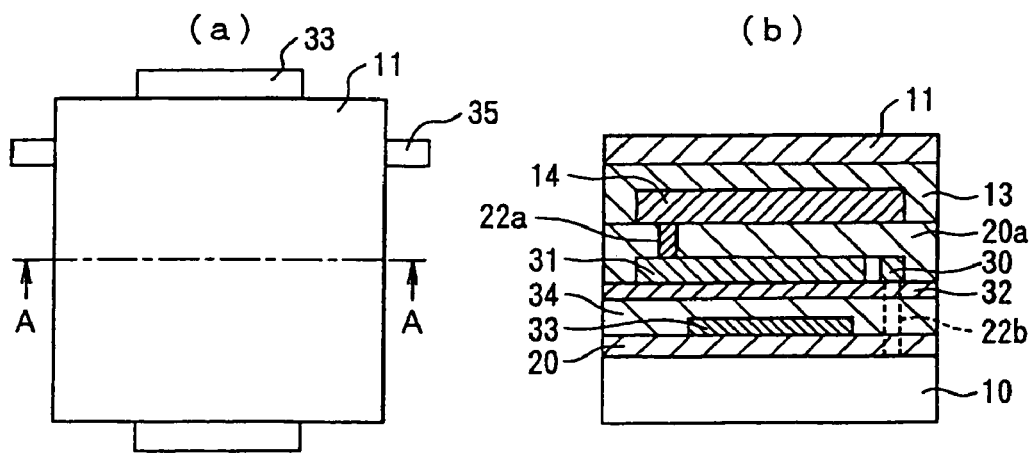

[Fig. 29]
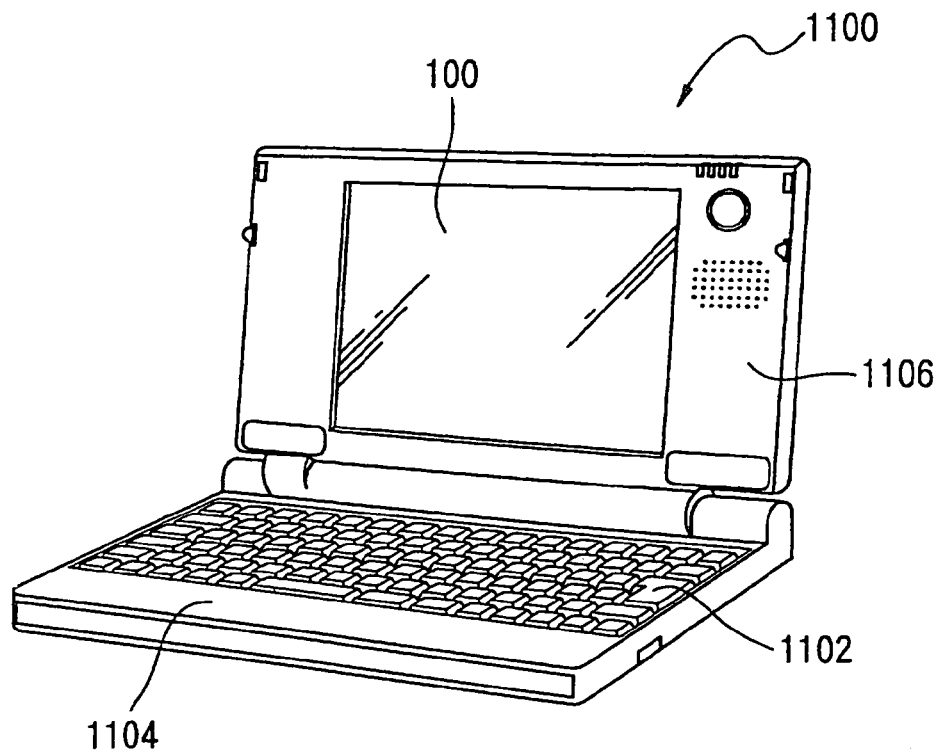
[Fig. 30]
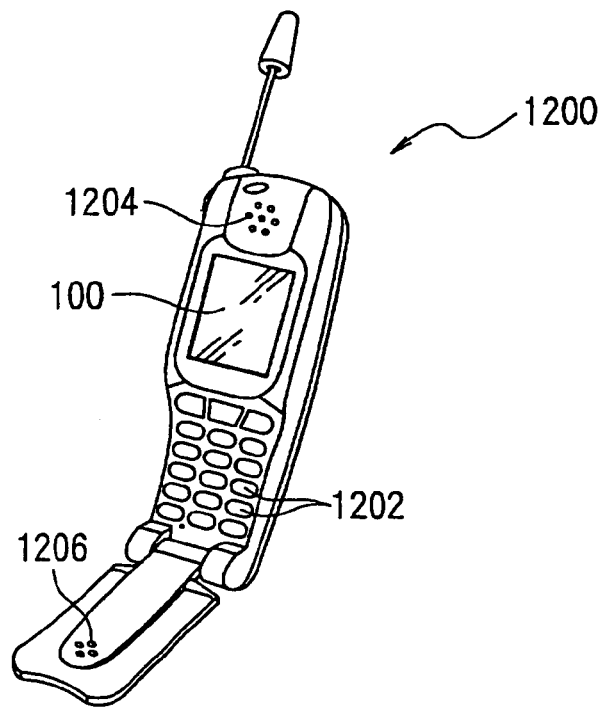

[Fig. 31]
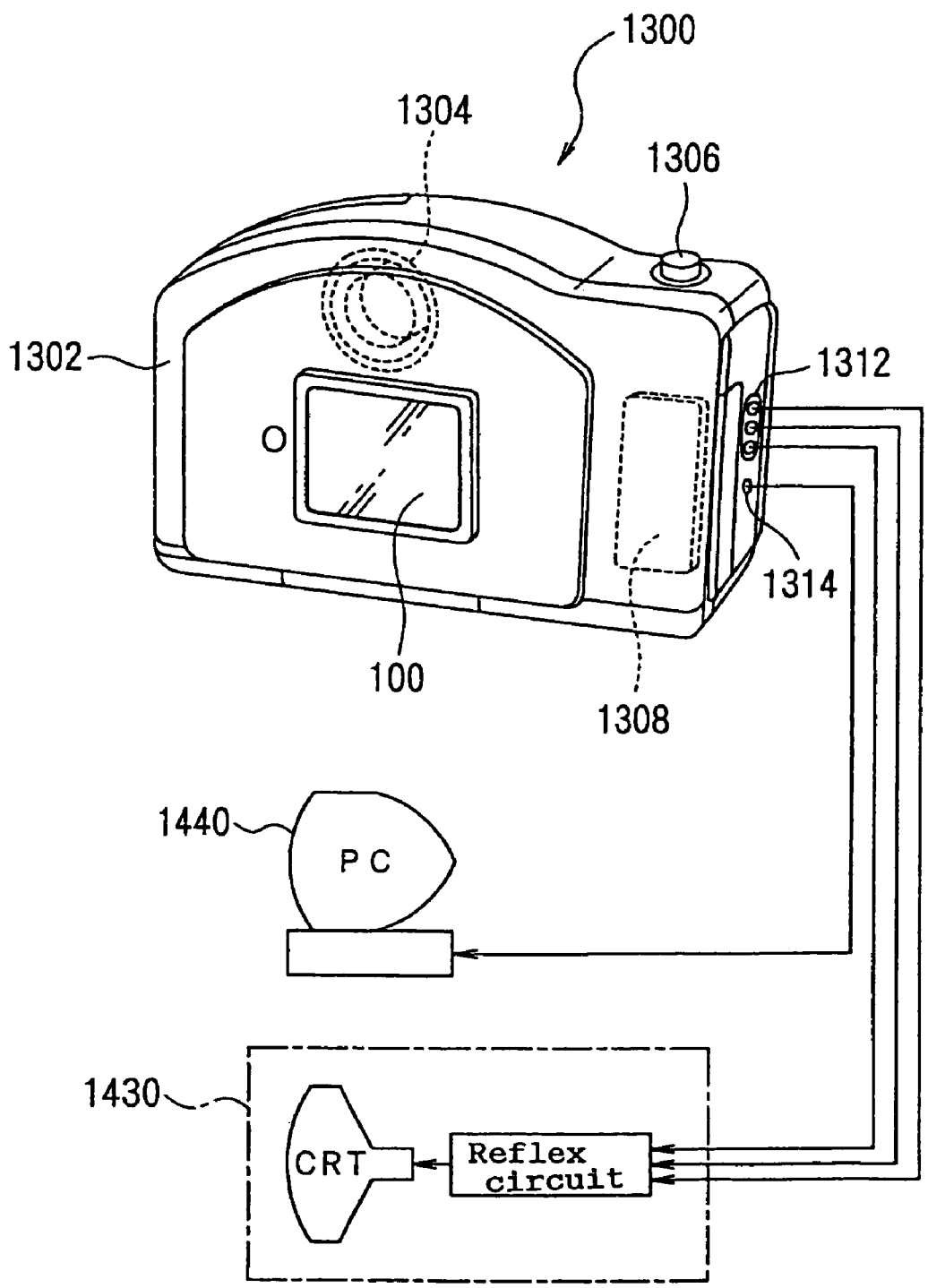

ORGANIC ELECTROLUMINESCENT DEVICE, METHOD OF MANUFACTURING THE SAME, AND ELECTRONIC APPARATUS

CROSS REFERENCE TO RELATED APPLICATIONS

This application is a divisional patent application of U.S. Ser. No. 10/002,393 filed Nov. 2, 2001, claiming priority to Japanese Application No. 2000-336391 filed Nov. 2, 2000 and Japanese Application No. 2001-336830 filed Nov. 1, 2001, all of which are hereby incorporated by reference.

TECHNICAL FIELD

The present invention relates to an organic electroluminescent device, a method of manufacturing the same, and an electronic apparatus. More specifically, the invention relates to an organic electroluminescent device for displaying various information, a method of manufacturing the same, and an electronic apparatus.

BACKGROUND OF THE INVENTION

Thin film transistors (TFTs) are mainly used for driving pixels of flat-panel-displays typified by liquid-crystal displays, or organic electroluminescent displays. Known thin-film transistors have an active layer comprising an inorganic semiconductor such as silicon or the like.

Since known inorganic semiconductor-thin-film transistors have a little flexibility, it has been difficult to obtain a display in a desired shape. Further, forming known thin-film transistors require complex processes and sophisticated equipment such as high-vacuum equipment.

Subsequently, a first object of the present invention is to provide an organic electroluminescent device which is driven by a thin-film transistor using a flexible organic-semiconductive material, and an electronic apparatus. The second object is to provide a method of manufacturing a thin-film transistor and an organic electroluminescent element using a simple method, such as a liquid-phase process.

SUMMARY OF THE INVENTION

An organic electroluminescent device according to the present invention comprises an organic thin-film transistor element including at least an active layer made from an organic-material, and an organic electroluminescent element driven by the organic thin-film transistor. As the organic thin-film transistor is adopted for driving the organic electroluminescent element, the entire manufacturing operation may be performed by inkjet processes without using special equipment. Accordingly, the manufacturing cost can be reduced.

The organic electroluminescent device may further comprise a substrate, and the organic electroluminescent element may be provided between the substrate and the organic thin-film transistor element. Otherwise, the organic thin-film transistor element may be provided between the substrate and the organic electroluminescent element. In either configuration, the substrate, the organic electroluminescent element, and the organic thin-film transistor element do not contact each other.

It is arranged that the area obtained by adding the area of a source region to the area of a drain region of the organic thin-film transistor element becomes larger than an area of a region (e.g., luminescent layer 13 in FIG. 5) in which a luminescent material is placed. The source and the drain, which form the organic thin-film transistor element, are configured to have bent parts that face each other at a predetermined spacing. A gate is provided covering the bent parts of the source and the drain. According to the above-described configuration, the width of the gate becomes longer, and the organic thin-film transistor element becomes adequate for driving the organic electroluminescent element. The bent parts of the source and the drain may be formed in a comb-shape, or a spiral-shape, facing each other at a predetermined spacing.

A method of manufacturing an organic electroluminescent device according to the present invention, comprises a step of forming an organic electroluminescent element for performing predetermined display above a substrate, and a step of forming an organic thin-film transistor element, which drives the organic electroluminescent element, above the organic electroluminescent element.

A method of manufacturing another organic electroluminescent device according to the present invention, comprises a step of forming an organic thin-film transistor element above a substrate, and a step of forming an organic electroluminescent element which is driven by the organic thin-film transistor element and performs a predetermined display, above the organic thin-film transistor element.

In either case, for performing the display, it is arranged that the area per pixel obtained by adding the area of a source region to the area of a drain region of the organic thin-film transistor element, is larger than the area of a region in which a luminescent material is disposed. The source and the drain, which form the organic thin-film transistor element, have bent parts that face each other at a predetermined spacing. A gate is provided covering the bent parts of the source and the drain. According to the configuration, the width of the gate becomes longer, and the organic thin-film transistor element becomes adequate for driving the organic electroluminescent element. The bent parts of the source and the drain are provided in a comb-shape, or a spiral-shape, facing each other at a predetermined spacing.

Further, at least the organic thin-film transistor and an organic luminescent layer of the organic electroluminescent element are formed by liquid-phase processes. Thus, the organic electroluminescent device can be manufactured without using a high-vacuum chamber. That is to say, the high-vacuum chamber can become unnecessary when the organic thin-film transistor and the organic-luminescent layer of the organic electroluminescent element are formed by the known liquid-phase processes, such as an inkjet method, spin coating, dipping, and so forth. Accordingly, the manufacturing cost is lowered.

In short, according to the configuration in which the organic thin-film transistor is adopted for driving the organic electroluminescent element, the organic electroluminescent device may be manufactured by the liquid-phase processes such as an inkjet process without using special devices or equipment.

An electronic apparatus according to the present invention comprises the organic electroluminescent device according to the present invention.

BRIEF DESCRIPTION OF THE DRAWINGS

FIG. 1 is a sectional view showing the configuration of a first embodiment of an organic electroluminescent device according to the present invention.

FIG. 2 is a sectional view showing the configuration of a second embodiment of an organic electroluminescent device according to the present invention.

FIG. 3 shows a first process for manufacturing the organic electroluminescent device according to the first embodiment of the present invention, wherein part (a) is a plan view and part (b) is a sectional view.

FIG. 4 shows a second process for manufacturing the organic electroluminescent device according to the first embodiment of the present invention, wherein part (a) is a plan view and part (b) is a sectional view.

FIG. 5 shows a third process for manufacturing the organic electroluminescent device according to the first embodiment of the present invention, wherein part (a) is a plan view and part (b) is a sectional view.

FIG. 6 shows a fourth process for manufacturing the organic electroluminescent device according to the first embodiment of the present invention, wherein part (a) is a plan view and part (b) is a sectional view.

FIG. 7 shows a fifth process for manufacturing the organic electroluminescent device according to the first embodiment of the present invention, wherein part (a) is a plan view and part (b) is a sectional view.

FIG. 8 shows a sixth process for manufacturing the organic electroluminescent device according to the first embodiment of the present invention, wherein part (a) is a plan view and part (b) is a sectional view.

FIG. 9 is a view showing a first step of procedures for forming a via hole.

FIG. 10 is a view showing a second step of the procedures for forming the via hole.

FIG. 11 is a view showing a third step of the procedures for forming the via hole.

FIG. 12 is a view showing a fourth step of the procedures for forming the via hole.

FIG. 13 is a view showing a fifth step of the procedures for forming the via hole.

FIG. 14 is a view showing a seventh process for manufacturing the organic electroluminescent device according to the first embodiment of the present invention, wherein part (a) is a plan view and part (b) is a sectional view.

FIG. 15 is a view showing an eighth process for manufacturing the organic electroluminescent device according to the first embodiment of the present invention, wherein part (a) is a plan view and part (b) is a sectional view.

FIG. 16 is a view showing a ninth process for manufacturing the organic electroluminescent device according to the first embodiment of the present invention, wherein part (a) is a plan view and part (b) is a sectional view.

FIG. 17 is a view showing a tenth process for manufacturing the organic electroluminescent device according to the first embodiment of the present invention, wherein part (a) is a plan view and part (b) is a sectional view.

FIG. 18 is a view showing an eleventh process for manufacturing the organic electroluminescent device according to the first embodiment of the present invention, wherein part (a) is a plan view and part (b) is a sectional view.

FIG. 19 is a view showing a twelfth process for manufacturing the organic electroluminescent device according to the first embodiment of the present invention, wherein part (a) is a plan view and part (b) is a sectional view.

FIG. 20 is a view showing a first process for manufacturing an organic electroluminescent device according to a second embodiment of the present invention, wherein part (a) is a plan view and part (b) is a sectional view.

FIG. 21 is a view showing a second process for manufacturing the organic electroluminescent device according to the second embodiment of the present invention, wherein part (a) is a plan view and part (b) is a sectional view.

FIG. 22 is a view showing a third process for manufacturing the organic electroluminescent device according to the second embodiment of the present invention, wherein part (a) is a plan view and part (b) is a sectional view.

FIG. 23 is a view showing a fourth process for manufacturing the organic electroluminescent device according to the second embodiment of the present invention, wherein part (a) is a plan view and part (b) is a sectional view.

FIG. 24 is a view showing a fifth process for manufacturing the organic electroluminescent device according to the second embodiment of the present invention, wherein part (a) is a plan view and part (b) is a sectional view.

FIG. 25 is a view showing a sixth process for manufacturing the organic electroluminescent device according to the second embodiment of the present invention, wherein part (a) is a plan view and part (b) is a sectional view.

FIG. 26 is a view showing a seventh process for manufacturing the organic electroluminescent device according to the second embodiment of the present invention, wherein part (a) is a plan view and part (b) is a sectional view.

FIG. 27 is a view showing an eighth process for manufacturing the organic electroluminescent device according to the second embodiment of the present invention, wherein part (a) is a plan view and part (b) is a sectional view.

FIG. 28 is a view showing a ninth process for manufacturing the organic electroluminescent device according to the second embodiment of the present invention, wherein part (a) is a plan view and part (b) is a sectional view.

FIG. 29 is a view showing an example in which an organic electroluminescent device having an electronic circuit of an embodiment of the present invention is applied to a mobile personal computer.

FIG. 30 is a view showing an example of a mobile phone to which an organic electroluminescent device having an electronic circuit of the present invention is applied for the display unit thereof.

FIG. 31 is a view showing an example of a digital-still camera to which an organic electroluminescent device having an electronic circuit of the present invention is applied for the finder.

DESCRIPTION OF THE EMBODIMENTS

The embodiments of the present invention will be described with reference to the drawings. In the following description, if a part included in one of the drawings is shown in another drawing, the part is denoted by the same reference numeral.

FIG. 1 is a sectional view showing the configuration of the first embodiment of an organic electroluminescent device according to the present invention, showing a part for one pixel. As shown in this figure, the organic electroluminescent device of this embodiment includes a transparent conductive film 11, a luminescent layer 13, an insulating film 12 provided around the luminescent layer 13, a cathode layer pattern 14, an interlayer-insulating film 20, a drain 31 and a source 30 that are provided facing each other, an organic-semiconductor layer 32, a gate insulating film 34, a gate line 33, an interlayer-insulating film 20a, and a source line 35 that are stacked on a transparent substrate 10 in that order. An interlayer wiring 22a electrically connects the drain 31 and the cathode-layer pattern 14, and an interlayer wiring 22b electrically connects the source 30 and the source line 35.

In the configuration shown in this figure, the transparent substrate 10 is used as a display surface, and the contents of the display provided by the luminescent layer 13 are observed through the transparent conductive film 11 and the transparent substrate 10. That is to say, the gate line 33, the drain 31, and the source 30, which form an organic thin-film transistor, drive an organic electroluminescent element including the luminescent layer 13, thereby displaying one pixel.

FIG. 2 is a sectional view showing the configuration of the second embodiment of the organic electroluminescent device according to the present invention, showing the configuration of one pixel. As shown in this figure, the organic electroluminescent device according to this embodiment includes a source line 35, an interlayer-insulating film 20, a gate line 33, a gate-insulating film 34, an organic-semiconductor layer 32, a drain 31 and a source 30 that are provided facing each other, an interlayer-insulating film 20a, an interlayer wiring 22, a cathode pattern 14, a luminescent layer 13, and a transparent conductive film 11 that are stacked on a substrate 10 in that order. An interlayer wiring 22a electrically connects the drain 31 and the cathode-layer pattern 14, and an interlayer wiring 22b electrically connects the source 30 and the source line 35.

In the configuration shown in this figure, the transparent conductive film 11 is used as a display surface, and the contents of the display provided by the luminescent layer 13, which is formed according to the shape of the cathode pattern 14, are observed through the transparent conductive film 11. That is to say, the gate line 33, the drain 31, and the source 30, which form an organic thin-film transistor, drive an organic electroluminescent element including the luminescent layer 13, thereby displaying one pixel.

The steps for manufacturing the organic electroluminescent device according to the first embodiment will now be described. FIGS. 3 to 19 show processes for manufacturing the organic electroluminescent device. In FIGS. 3 to 8 and 14 to 19, parts (a) are plan views, and parts (b) are sectional views through portions A-A shown in the parts (a). FIGS. 9 to 13 are sectional views.

In FIG. 3, the substrate 10 is made of a transparent material such as glass, quartz, or plastic (synthetic resin). It is preferable that the transparent conductive film 11 be made of ITO (indium tin oxide). However, the transparent conductive film 11 may be made of materials other than ITO film, as long as the materials are transparent and highly conductive. In this embodiment, glass and ITO is used.

In FIG. 4, the insulating film 12 is provided for preventing a leakage current between the cathode pattern 14 and the transparent conductive layer 11. In this embodiment, $SiO_2$ is used. Other materials may be used, as long as they are insulative. Polyimide resin or the like, which is an organic material, may be used. In this embodiment, using a liquid material obtained by dissolving polysilazane in xylene as the material, the insulating film 12 is formed by an inkjet (I/J) method only for areas other than a cylindrical hole that forms a luminescent area. The polysilazane solution is applied by an I/J method, and is heated to a temperature of 250° C. for 10 minutes. Thus, an $SiO_2$ film that is 150 nm thick is formed in a desired shape.

In FIG. 5, the luminescent layer 13 may comprise two layers including a hole-injecting layer for injecting a hole and a light-emitting organic electroluminescent layer. Both the materials are formed by an I/J method, but may be formed by spin coating, vapor deposition, and so forth.

The luminescent layer 13 is formed in the cylindrical hole of the insulating film 12. In this embodiment, only the organic electroluminescent layer is formed by an I/J method. The luminescent layer 13 is formed by applying a liquid material that is a solution in which a polyfluorene polymer is dissolved in a xylene solvent, using an I/J method, and by drying and removing the solvent. The luminescent layer 13 is about 80 nm thick. For the organic electroluminescent layer, an organic electroluminescent material such as polyparaphenylene vinylene (PPV) may be used.

In FIG. 6, the cathode-layer pattern 14 is made of metal. Using materials such as gold, silver, copper and so forth, the cathode-layer pattern 14 is formed by patterning using an I/J method. Other metal such as aluminum may be formed by a method such as vapor deposition. In this embodiment, a solution in which gold complex is dissolved in an ethanol solution is used. As the gold complex, a material denoted by $(CH_3)_3$—P—Au—$CH_3$ is used. The concentration of the material is 2 percent by weight. The solution is applied by an I/J method, and is heated to a temperature of 80° C. Thus, a gold-film pattern which is 50 nm thick, and exhibits good conductivity is obtained.

Next, as shown in FIG. 7, the interlayer-insulating film 20 is formed. For the interlayer-insulating film 20, a polymeric material such as polyvinyl alcohol (PVA) or polyimide is used. An inorganic material such as $SiO_2$ may be used. When the polymeric material is used, a film is formed by spin coating, an I/J method, and so forth. In this embodiment, PVA water solution is spin coated for forming a PVA film having a thickness of 1.5 μm.

A via hole 21a for performing interlayer wiring is formed as shown in FIG. 8. The details of processes for forming the via hole are shown in FIGS. 9 to 13.

As shown in FIG. 9, the interlayer-insulating film 20 is formed on the entire surface of a layer 40 that is provided directly underneath. As shown in FIG. 10, a self-organizing film 41 is formed on the interlayer-insulating film 20. The self-organizing film 41 is an organic monomolecular film including a water-repellent fluoroalkyl group on the surface thereof. When the self-organizing film 41 is irradiated with ultraviolet light through a photomask 42, as shown in FIG. 11, only the parts that are irradiated by ultraviolet light are removed, whereby a self-organizing film pattern 43 is formed and the interlayer-insulating film 20 is exposed, as shown in FIG. 12. When the interlayer-insulating film 20 is formed with soluble polymers such as PVA, parts of the interlayer-insulating film 20 are dissolved and removed by being dipped in a desired solvent, whereby a pattern 44 of the interlayer-insulating film is formed, as shown in FIG. 13. In this embodiment, pure water is used to dissolve and remove the parts of the PVA. After the parts of the PVA are removed, the entire surface of the substrate is irradiated with ultraviolet light, whereby the self-organizing film that is left on the surface of the substrate is decomposed and removed, although this is not shown in the figure. As the circular self-organizing film pattern 43 is removed by using ultraviolet light, the via hole is formed in the interlayer-insulating film. The via hole may be formed in other ways, such as etching using photolithography or discharging a solvent that is capable of dissolving the interlayer-insulating film using an I/J method.

When the via hole is formed, the interlayer wiring 22a is formed by applying a liquid-gold-material-in-toluene solution inside the via hole using an I/J method, as shown in FIG. 14.

Next, the source 30 and the drain 31 are formed as shown in FIG. 15. As shown in the figure, the source 30 and the drain 31 have bent parts facing each other at a predetermined spacing. That is to say, the source 30 is comb-shaped, as it has projecting parts 30a to 30d. Likewise, the drain 31 is comb-shaped, as it has projecting parts 31a to 31d. The projecting parts 30a to 30d of the source 30 and the projecting parts 31a to 31d of the drain 31 are alternately aligned, as if the comb-shaped parts are meshed. Accordingly, the comb-shaped parts of the source 30 and the comb-shaped parts of the drain 31 are formed facing each other at a predetermined spacing.

The drain 31 is formed so as to connect with the cathode layer. The source 30 and the drain 31 may be formed using materials such as metal or a conductive polymeric material. The source 30 and the drain 31 may be patterned by an I/J method. In this embodiment, a liquid-gold-material-in-toluene solution is applied by an I/J method. The gold film obtained in that manner is about 50 nm thick.

The organic-semiconductor layer 32 is formed as shown in FIG. 16. The organic-semiconductor layer 32 may be made of organic materials, by spin coating, vapor deposition, an I/J method, and so forth. In this embodiment, an organic-semiconductor film made of anthracene is formed by spin coating a liquid material in which anthracene is dissolved in a xylene solvent. The thickness of the organic-semiconductor film is 200 nm. Other organic-semiconductor materials, such as tetracene or pentacene may be used.

Then, the gate-insulating film 34 is formed as shown in FIG. 17. For the gate-insulating film 34, the same materials as those for the interlayer-insulating film may be used. In this embodiment, a PVA film is used, and the PVA film is formed to a thickness of 1 µm by spin coating.

The gate line 33 is formed so as to cover the bent parts of the source 30 and the drain 31, as shown in FIG. 17. That is to say, the gate line 33 covers the bent parts of the source 30 and the drain 31, which face each other at a predetermined spacing. Hence, the width of the gate becomes longer. The gate line 33 is formed by using a liquid-gold-material-in-toluene solution, as in the case of the source 30 and the drain 31. As the solvent for the liquid-gold material, toluene is used, and the metal film obtained has a thickness of about 50 nm.

After the interlayer-insulating film 20a is formed, a via hole 21b is formed in the above-described manner, as shown in FIG. 18. This time, however, a part of the PVA film is dissolved and removed with pure water, and a part of the organic-semiconductor layer is dissolved and removed by xylene, for electrically connecting a source line and the source 30.

Finally, the source line 35 is formed as shown in FIG. 19. The source line 35 is formed with the interlayer wiring 22b, so as to connect with the source 30. A liquid-gold-material-in-toluene solution is used as the material, as in the case of the source 30 and the drain 31, and an I/J method is used for forming the source line. The thickness of the obtained gold film is about 50 nm. Thus, the basic processes are completed. Further, a protecting film or the like may be formed on the source line 35.

In the organic electroluminescent device which is formed as described above, the source 30, the drain 31 and the gate line 33 form a thin-film transistor.

Next, the steps of manufacturing the organic electroluminescent device according the second embodiment of the present invention will now be described. FIGS. 20 to 28 show the steps of manufacturing the organic electroluminescent device. In FIGS. 20 to 28, parts (a) are plan views, and parts (b) are sectional views through portions A-A shown in the parts (a).

First, the source line 35 is formed on the substrate 10, as shown in FIG. 20. The source line 35 is formed, using a liquid-gold-material-in-toluene solution, by an I/J method. The thickness of the gold film obtained is about 50 nm. Then, the interlayer-insulating film 20 is formed. Using a PVA film, the interlayer insulating film 20 is formed to a thickness of 1 µm by an I/J method. The PVA film is formed in such a manner that no PVA film is formed at an area above the source line 35. The via hole 21b is formed in the interlayer-insulating film 20 as described above.

The gate line 33 is formed as shown in FIG. 21. Using a liquid-gold-material-in-toluene solution, the gate line 33 is formed using an I/J method. The thickness of the gold film obtained is about 50 nm. Then, the gate-insulating film 34 is formed. For the gate-insulating film 34, a PVA film is formed to a thickness of 1 µm using an I/J method. The PVA film is formed in such a manner that no PVA film is formed at an area above the source line 35.

The organic-semiconductor layer 32 is formed as shown in FIG. 22. The organic-semiconductor material used for the organic-semiconductor layer 32 is the same as that used in the above-described first embodiment. The organic-semiconductor layer 32 is formed to a thickness of 200 nm in thickness using an I/J method. An organic-semiconductive film is formed in such a manner that no organic-semiconductive film is formed at an area above the source line.

Next, by applying a liquid-gold-material-in-toluene solution using an I/J method, the interlayer wiring 22b is formed as shown in FIG. 23. After that, the source 30 and the drain 31 are formed as shown in FIG. 24.

In that case, as shown in this figure, the source 30 and the drain 31 have the bent parts which face each other at a predetermined spacing. That is to say, the source 30 has projecting parts 30a to 30d, and is formed in a comb-shape. Likewise, the drain 31 has projecting parts 31a to 31d, and is formed in a comb-shape. The projecting parts 30a to 30d of the source 30 and the projecting parts 31a to 31d of the drain 31 are alternately aligned, so that the comb-shaped parts are meshed. Accordingly, the comb-shaped parts of the source 30 and the comb-shaped parts of the drain 31 are formed facing each other at a predetermined spacing. Accordingly, as the gate line 33 covers the bent parts of the source 30 and the drain 31, the width of the gate becomes longer.

The source 30 is formed so as to connect with the source line 35. In this embodiment, a liquid-gold material is applied using an I/J method. Ethanol is used as the solvent of the liquid-gold material. The thickness of the gold film obtained is about 50 nm.

Then, the interlayer-insulating film 20a is formed as shown in FIG. 25. Using a PVA film, the interlayer-insulating film 20a is formed to a thickness of 1 µm using an I/J method. The PVA film is formed in such a manner that no PVA film is formed at an area above the drain 31. The via hole 21a is formed in the interlayer-insulating film 20a as described above.

Further, the interlayer wiring 22a is formed as shown in FIG. 26. In this embodiment, a liquid-gold-material-in-toluene solution is applied using an I/J method. Then, as shown in the figure, the cathode pattern 14 is formed so as to connect with the drain 31.

Further, the luminescent layer 13 is formed as shown in FIG. 27. The luminescent layer 13 is formed by spin coating. The material of the luminescent layer 13 is the same as that of the first embodiment. Finally, as shown in FIG. 28, the transparent conductive film 11 is formed on the entire surface using a sputtering method. The thickness of the film obtained is 150 nm. The processes are thus completed. Next, a transparent protection film may be formed on the transparent conductive film 11.

In the organic electroluminescent device configured as described above, the source 30, the drain 31, and the gate line 33 form the organic thin-film transistor.

In the organic electroluminescent device obtained in the above-described first and second embodiments, the organic-thin-film transistor controls the organic electroluminescent element.

In the above-described first and second embodiments, the source and the drain, which form the organic thin-film transistor element, are provided facing each other at a predetermined spacing, forming a comb-shape. When the source and the drain are provided facing each other at a predetermined spacing, the width of the gate becomes longer. Therefore, the source and the drain may be formed in a spiral-shape, not in a comb-shape, facing each other at a predetermined spacing. When the source and the drain are formed in a spiral-shape, the spiral-shaped source and the spiral-shaped drain that winds in the same direction as that of the source may be formed at a predetermined spacing. That is to say, the width of the gate becomes longer when the source and the drain are provided with the bent parts facing each other at a predetermined spacing. Accordingly, the organic thin-film transistor element is suitable for driving the organic electroluminescent element.

With reference to the description above, the present invention may have the following forms.

(1) An organic electroluminescent device according to any of the above embodiments, further comprising interlayer wiring that electrically connects the organic thin-film transistor element with the organic electroluminescent element.

(2) A method of manufacturing an electroluminescent device according to any of the above methods, further comprising a step of providing interlayer wiring that electrically connects the organic thin-film transistor element with the organic electroluminescent element.

Next, examples of the electronic apparatus to which the above-described organic electroluminescent device is applied will now be described. FIG. 29 is a perspective view showing the configuration of a mobile personal computer to which the described organic electroluminescent device is applied. In this figure, a personal computer 1100 includes a main unit 1104 having a keyboard 1102, and a display unit 1106. The display unit 1106 includes the described organic electroluminescent device 100.

FIG. 30 is a perspective view showing the configuration of a mobile phone to which the above-described organic electroluminescent device 100 is applied to the display unit thereof. In this figure, a mobile phone 1200 includes a plurality of operating buttons 1202, a reception port 1204, a transmission port 1206, and the above-described organic electroluminescent device 100.

FIG. 31 is a perspective view showing the configuration of a digital still camera in which the described organic electroluminescent device 100 is applied to the finder thereof. Also, the figure briefly shows the connection with external devices. In an ordinary camera, a film senses light from an optical image of a subject. On the contrary, the digital still camera 1300 generates an image-pickup signal by opto-electronically converting the optical image of the subject using an image-pickup device such as a CCD (Charge Coupled Device). The described organic electroluminescent device 100 is provided in the back of a case 1302 of the digital still camera 1300, for providing display based on an image-pickup signal provided by the CCD. The organic electroluminescent device 100 functions as the finder for displaying the subject. A light-receiving unit 1304 that includes an optical lens and the CCD is provided at the viewing side (the rear side in the figure) of the case 1302.

When a photographer confirms a subject image that is displayed on the organic electroluminescent device 100, and presses a shutter button 1306, the image-pickup signal provided by the CCD at that very time is transferred and stored in a memory on a circuit board 1308. In the digital still camera 1300, a video-signal output terminal 1312 and an input-output terminal 1314 for data communication are provided on the side of the case 1302. As shown in the figure, a television monitor 1430 is connected to the video-signal output terminal 1312, and a personal computer 1430 is connected to the input-output terminal 1314, as the need arises. Further, the image-pickup signal, which is stored in the memory on the circuit board 1308 by a predetermined operation, is output to the television monitor 1430 and the personal computer 1440.

The electronic apparatus to which the organic electroluminescent device 100 of the present invention is applied includes a television, a viewfinder-type video tape recorder, a monitor-direct-view-type video-tape recorder, a car navigation system, a pager, an electronic personal organizer, an electronic calculator, a word processor, a workstation, a video phone, a POS terminal, and a device having a touch panel, in addition to the personal computer in FIG. 29, the mobile phone in FIG. 30, and the digital still camera in FIG. 31. Of course, the described organic electroluminescent device 100 may be applied to the above-described electronic apparatus as the display unit thereof.

The organic thin-film transistor is mechanically flexible, and may be made by a liquid-phase process. Because of these advantages, the organic thin-film transistor may be used for a sheet display that is formed on, for example, a plastic substrate, a paper-like substrate, and so forth.

(Advantages)

As has been described in the present invention, the organic thin-film transistor is adopted for driving the organic electroluminescent element. Subsequently, no special devices are required, and the entire manufacturing operation may be performed by inkjet processes. Accordingly, the manufacturing cost is reduced. Further, for one pixel, the size of the organic thin-film transistor element is arranged to be larger than that of the organic electroluminescent element. The source and the drain, which form the thin-film transistor element, are configured to have bent parts facing each other at a predetermined spacing. By providing the gate covering the bent parts of the source and the drain, the width of the gate becomes longer. Accordingly, the organic thin-film transistor element is suitable for driving the organic electroluminescent element.

The invention claimed is:

1. A method of manufacturing an organic electroluminescent device having a display area and a non-display area, comprising:
   a step of forming an organic electroluminescent element above a substrate in the display area; and
   a step of forming an organic thin-film transistor element, for driving the organic electroluminescent element, above the organic electroluminescent element, the thin-film transistor element including a source, drain, semiconductor layer, and gate that are each formed to overlap the display area.

2. The method of manufacturing an organic electroluminescent device according to claim 1, wherein, in each pixel, a total area of a source region area and drain region area of the organic thin-film transistor element is larger than an area of a region provided with a luminescent material.

3. The method of manufacturing an organic electroluminescent device according to claim 1, wherein the source and the drain, which constitute the organic thin-film transistor element, have bent parts that face each other at a predetermined spacing.

4. The method of manufacturing an organic electroluminescent device according to claim 3, wherein the gate is provided so as to cover the bent parts of the source and the drain.

5. The method of manufacturing an organic electroluminescent device, according to claim 3, wherein the bent parts of the source and the drain are provided in a comb-shape and face each other at a predetermined spacing.

6. The method of manufacturing an organic electroluminescent device, according to claim 3, wherein the bent parts of the source and the drain are provided in a spiral-shape and face each other at a predetermined spacing.

7. The method of manufacturing an organic electroluminescent device, according to claim 1, wherein, at least the organic thin-film transistor and an organic-luminescent layer of the organic electroluminescent element are formed by a liquid-phase process.

8. A method of manufacturing an organic electroluminescent device including a display area and non-display area, comprising:
   a step of forming one of an organic electroluminescent element and an organic thin-film transistor element above a substrate; and
   a step of forming the other of the organic electroluminescent element and the organic thin-film transistor element above the one of the organic electroluminescent element and an organic thin-film transistor element, the organic electroluminescent element being driven by the organic thin-film transistor element and performing predetermined display
   wherein the thin-film transistor element includes a source, drain, semiconductor layer, and gate that are each formed to overlap the display area.

9. The method of manufacturing an organic electroluminescent device, according to claim 8, wherein, at least the organic thin-film transistor and an organic-luminescent layer of the organic electroluminescent element are formed by a liquid-phase process.

10. The method of manufacturing an organic electroluminescent device according to claim 8, wherein, in each pixel, a total area of a source region area and drain region area of the organic thin-film transistor element is larger than an area of a region provided with a luminescent material.

11. The method of manufacturing an organic electroluminescent device according to claim 8, wherein the source and the drain, which constitute the organic thin-film transistor element, have bent parts that face each other at a predetermined spacing.

12. The method of manufacturing an organic electroluminescent device according to claim 8, wherein the gate is provided so as to cover the bent parts of the source and the drain.

* * * * *